United States Patent
Zhou

(10) Patent No.: US 12,464,929 B2
(45) Date of Patent: Nov. 4, 2025

(54) ORGANIC LIGHT-EMITTING DIODE DISPLAY PANEL COMPRISING UNDERCUT IN PASSIVATION LAYER AND MANUFACTURING METHOD THEREOF

(71) Applicant: Shenzhen China Star Optoelectronics Semiconductor Display Technology Co., Ltd., Shenzhen (CN)

(72) Inventor: Wanliang Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/773,047

(22) PCT Filed: Apr. 18, 2022

(86) PCT No.: PCT/CN2022/087364
§ 371 (c)(1),
(2) Date: Apr. 29, 2022

(87) PCT Pub. No.: WO2023/184609
PCT Pub. Date: Oct. 5, 2023

(65) Prior Publication Data
US 2025/0081805 A1    Mar. 6, 2025

(30) Foreign Application Priority Data
Mar. 28, 2022 (CN) .......................... 202210313901.0

(51) Int. Cl.
*H10K 59/80* (2023.01)
*H10K 59/12* (2023.01)

(52) U.S. Cl.
CPC ... *H10K 59/80522* (2023.02); *H10K 59/1201* (2023.02); *H10K 59/873* (2023.02)

(58) Field of Classification Search
None
See application file for complete search history.

(56) References Cited

U.S. PATENT DOCUMENTS

2011/0101333 A1* 5/2011 Shionoiri .......... H01L 21/76254
                                                            257/43
2016/0149155 A1* 5/2016 Kim ..................... H10K 59/124
                                                            438/23
(Continued)

FOREIGN PATENT DOCUMENTS

CN    1693972 A    11/2005
CN    108022953 A    5/2018
(Continued)

OTHER PUBLICATIONS

International Search Report in International application No. PCT/CN2022/087364, mailed on Nov. 30, 2022.
(Continued)

*Primary Examiner* — Nduka E Ojeh
(74) *Attorney, Agent, or Firm* — Nathan & Associates Patent Agents Ltd.; Menachem Nathan

(57) ABSTRACT

An organic light-emitting diode display panel and a manufacturing method thereof are provided. The organic light-emitting diode display panel includes a substrate, a thin film transistor layer, a passivation layer, and a cathode sequentially disposed in a stack. The thin film transistor layer includes a source electrode, a drain electrode, and an auxiliary cathode. The passivation layer includes a first passivation layer and a second passivation layer. An undercut structure is formed between the first passivation layer and the second passivation layer. The undercut structure exposes (Continued)

the auxiliary cathode. The cathode extends into the undercut structure and is connected to the auxiliary cathode.

18 Claims, 10 Drawing Sheets

(56) References Cited

U.S. PATENT DOCUMENTS

2017/0317154 A1* 11/2017 Heo .................. H10K 59/1213
2022/0093721 A1*  3/2022 Kim .................... H10K 71/00

FOREIGN PATENT DOCUMENTS

| | | |
|---|---|---|
| CN | 108023026 A | 5/2018 |
| CN | 109979964 A | 7/2019 |
| CN | 109980119 A | 7/2019 |
| CN | 110034156 A | 7/2019 |
| CN | 110235256 A | 9/2019 |
| CN | 113871433 A | 12/2021 |
| CN | 114141717 A | 3/2022 |
| KR | 20170063326 A | 6/2017 |

OTHER PUBLICATIONS

Written Opinion of the International Search Authority in International application No. PCT/CN2022/087364, mailed on Nov. 30, 2022.
Chinese Office Action issued in corresponding Chinese Patent Application No. 202210313901.0 dated Dec. 4, 2024, pp. 1-7.

* cited by examiner

ORGANIC LIGHT-EMITTING DIODE DISPLAY PANEL COMPRISING UNDERCUT IN PASSIVATION LAYER AND MANUFACTURING METHOD THEREOF

BACKGROUND OF INVENTION

Field of Invention

The present application relates to a display technology field, and in particular to an organic light-emitting diode display panel and a manufacturing method thereof.

Description of Prior Art

Organic light-emitting diode display panels can be divided into a top emission type and a bottom emission type according to light emission direction. In current organic light-emitting diode display panels of the top emission type, as cathodes are full surface electrodes, in order to increase a light transmittance rate, the cathodes need to be as thin as possible. However, the thinner the thickness of cathode layers is, the larger the resistance is. When electrical signals are provided from edges of the display panels to the cathodes, voltage drop (internal resistance (IR) Drop) can gradually increase from an edge of the display panels to a center of the display panels. After the display panels are lit up, a phenomenon of a bright edge and a dark middle appears. This phenomenon is more serious in large-sized display panels and has become one of problems that large-sized organic light-emitting diode display panels need to be overcome.

The problem of the voltage drop can be solved by disposing auxiliary cathodes on array substrates. The cathodes and auxiliary cathodes are connected through via holes. However, during evaporation processes of electron transfer layers and/or electron inject layers, the electron transfer layers and/or the electron inject layers can enter the via holes and occupy the via holes, thereby preventing the cathodes from connecting to the auxiliary cathodes in the via holes.

SUMMARY OF INVENTION

In this light, the present application provides an organic light-emitting diode display panel and a manufacturing method thereof which are able to improve connection performance between a cathode and an auxiliary cathode.

The present application provides an organic, including:
a substrate;
a thin film transistor layer disposed on the substrate; wherein the thin film transistor layer includes a source electrode, a drain electrode, and an auxiliary cathode, and the auxiliary cathode is disposed in a same layer with the source electrode and the drain electrode;
a passivation layer covering a side of the thin film transistor layer away from the substrate; and
a cathode disposed on a side of the passivation layer away from the thin film transistor layer; and
wherein the passivation layer includes a first passivation layer and a second passivation layer, the second passivation layer is located on a side of the first passivation layer away from the thin film transistor layer, a first through hole is defined in the first passivation layer, a second through hole is defined in the second passivation layer, the first through hole communicates with the second through hole, the first through hole and the second through hole constitute an undercut structure, the undercut structure exposes the auxiliary cathode, and wherein the cathode extends into the undercut structure and is connected to the auxiliary cathode.

Optionally, in one embodiment, a material of the first passivation layer includes silicon oxide, and a material of the second passivation layer includes silicon nitride.

Optionally, in one embodiment, the cathode is located on a lateral wall of the undercut structure and is connected to the auxiliary cathode.

Optionally, in one embodiment, the organic light-emitting diode display panel further includes an electronic functional layer, the electronic functional layer is disposed on a side of the cathode close to the passivation layer, a part of the electronic functional layer is located on the auxiliary cathode in the undercut structure, and the cathode is located between a part of the electronic functional layer and the lateral wall of the undercut structure.

Optionally, in one embodiment, the electronic functional layer includes at least one of an electron transfer layer or an electron inject layer.

Optionally, in one embodiment, the auxiliary cathode includes a conductive metal layer and a protection metal layer, the conductive metal layer is disposed between the protection metal layer and the substrate, and a material of the protection metal layer is resistant to corrosion of hydrofluoric acid.

Optionally, in one embodiment, the organic light-emitting diode display panel further includes a planarization layer, the planarization layer is disposed on a side of the passivation layer away from the thin film transistor layer, a third through hole is defined in the planarization layer, the third through hole communicates with the second through hole, and the cathode extends from the third through hole into the undercut structure.

Optionally, in one embodiment, the organic light-emitting diode display panel includes a plurality of sub-pixels arranged in an array manner, a light-emitting region and a non-light-emitting region are divided in each of the sub-pixels, the first through hole, the second through hole, and the third through hole constitute an auxiliary cathode connection hole, and the auxiliary cathode connection hole is disposed in the non-light-emitting region.

Optionally, in one embodiment, a depth of the undercut structure is greater than 0.2 μm.

The present application further provides a manufacturing method of the organic light-emitting diode display panel, including following steps:
providing a substrate;
forming a thin film transistor layer on the substrate, wherein the thin film transistor layer includes a source electrode, a drain electrode, and an auxiliary cathode, and the auxiliary cathode is disposed in a same layer with the source electrode and the drain electrode;
forming a passivation layer on the thin film transistor layer, wherein the passivation layer includes a first passivation layer and a second passivation layer, and the second passivation layer is located on a side of the first passivation layer away from the thin film transistor layer; and
using an etching solution to etch the first passivation layer and the second passivation layer to respectively form a first through hole and a second through hole, wherein the first through hole and the second through hole are communicated and constitute an undercut structure, an etching rate of the etching solution to the first passivation layer is greater an etching rate of the etching solution to the second passivation layer, the undercut structure exposes the auxiliary cathode; and forming a cathode on the passivation layer, wherein the cathode extends into the undercut structure and is connected to the auxiliary cathode.

Optionally, in one embodiment, after forming the passivation layer on the thin film transistor layer, and before using the etching solution to etch the first passivation layer and the second passivation layer, the manufacturing method further includes:

using an etching gas to simultaneously etch the first passivation layer and the second passivation layer to from a prefabricated hole in the first passivation layer, wherein the prefabricated hole penetrates through the first passivation layer and the second passivation layer and forms a contact hole on the thin film transistor layer to expose the source electrode of the thin film transistor layer; and wherein using the etching solution to etch the first passivation layer and the second passivation layer includes:

using the etching solution to etch the first passivation layer and the second passivation layer at the prefabricated hole.

Optionally, in one embodiment, after forming the passivation layer on the thin film transistor layer, and before using the etching solution to etch the first passivation layer and the second passivation layer, the manufacturing method further includes:

forming a planarization layer on the passivation layer; and using a halftone mask to pattern the planarization layer to form a third through hole and a first blind via in the planarization layer; and wherein using the etching solution to etch the first passivation layer and the second passivation layer includes:

etching the first passivation layer and the second passivation layer at the third through hole;

wherein after using the etching solution to etch the first passivation layer and the second passivation layer, the manufacturing method further includes:

performing dry etching at the first blind via to form a through hole from the first blind via; and etching the first passivation layer and the second passivation layer at the through hole to form a contact hole to expose the source electrode of the thin film transistor layer.

Optionally, in one embodiment, the organic light-emitting diode display panel includes a plurality of sub-pixels arranged in an array manner, a light-emitting region and a non-light-emitting region are divided in each of the sub-pixels, the first through hole, the second through hole, and the third through hole constitute an auxiliary cathode connection hole, and the auxiliary cathode connection hole is disposed in the non-light-emitting region.

Optionally, in one embodiment, the first passivation layer includes silicon oxide, the second passivation layer includes silicon nitride, the etching solution is hydrofluoric acid, and an etching rate ratio of the etching solution of silicon oxide to silicon nitride is greater than or equal to 10.

Optionally, in one embodiment, before forming the cathode on the passivation layer, the manufacturing method further includes forming an electronic functional layer on the passivation layer, under occlusion of the undercut structure, a part of the electronic functional layer is located on the auxiliary cathode in the undercut structure, a reserved space is formed around the part of the electronic functional layer; and in the step of forming the cathode on the passivation layer, the cathode occupies the reserved space.

Optionally, in one embodiment, the electronic functional layer includes at least one of an electron transfer layer or an electron inject layer.

Optionally, in one embodiment, the auxiliary cathode includes a conductive metal layer and a protection metal layer, the conductive metal layer is disposed between the protection metal layer and the substrate, and a material of the protection metal layer is resistant to corrosion of hydrofluoric acid.

Optionally, in one embodiment, a depth of the undercut structure is greater than 0.2 µm.

In the organic light-emitting diode display panel of the present application, the passivation layer is used to form the undercut structure, which is able to improve connection performance of the cathode and the auxiliary cathode and to reduce the voltage drop.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation higher than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation lower than the sea level elevation of the second feature. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly.

An organic light-emitting diode display panel in embodiments of the present application can be used in mobile phones, tablet PCs, e-readers, electronic display screens, laptops, mobile phones, augmented reality (AR) \virtual reality (VR) devices, media players, wearable devices, digital cameras, car navigation instrument, etc. Specifically, the organic light-emitting diode display panel can be an active-matrix organic light-emitting diode (AMOLED) display panel, and can also be a passive matrix organic light-emitting diode (PMOLED) display panel.

Figure 1:
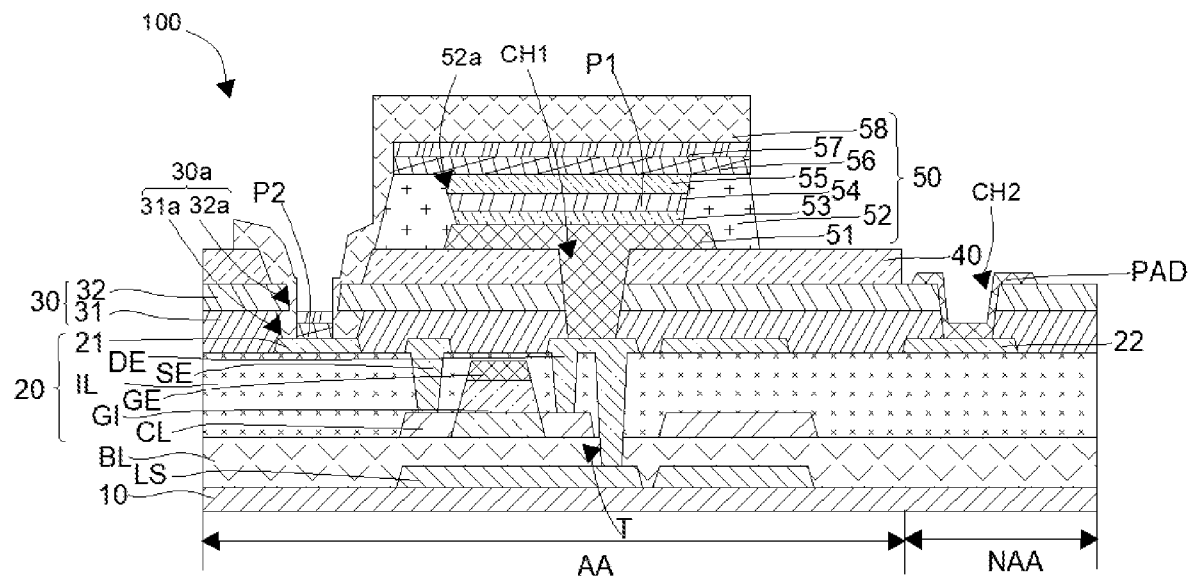
FIG. 1 is a structural schematic diagram of a display panel provided by one embodiment of the present application.

Please refer to FIG. 1, the organic light-emitting diode display panel 100 of one embodiment of the present application includes a substrate 10, a light-shielding layer LS, a buffer layer BL, a thin film transistor layer 20, a passivation layer 30, a planarization layer 40, and an organic light-emitting layer 50. The thin film transistor layer 20, the passivation layer 30, the planarization layer 40, and the organic light-emitting layer 50 are sequentially stacked on the substrate 10.

The substrate 10 can be glass, plastic, or a flexible substrate. The flexible substrate can be constituted by a single-layer flexible organic layer, and can also be constituted by two or more layers of the flexible organic layers. Optionally, the substrate 10 includes two layers of the flexible organic layers stacked sequentially and a barrier layer disposed between the two layers of the flexible organic layers. Materials of the two flexible organic layers are independently selected from one polyimide (PI), polyethylene naphthalate (PEN), polyethylene terephthalate (PET), polyarylate (PAR), polycarbonate (PC), polyetherimide (PEI), or polyethersulfone (PES). The barrier layer is selected from inorganic materials such as silicon dioxide, or silicon nitride, etc.

The light-shielding layer LS is disposed on the substrate 10. The light-shielding layer LS is configured to prevent an active layer CL of an thin film transistor in the thin film transistor layer 20 from being affected by light. Optionally, a material of the light-shielding layer LS is selected from one of copper (Cu), tantalum (Ta), tungsten (W), molybdenum (Mo), aluminum (Al), titanium (Ti), a copper-niobium (CuNb) alloy, a laminated layer of copper (Cu) and molybdenum (Mo), a laminated layer of copper (Cu) and a molybdenum titanium (MoTi) alloy, a laminated layer of copper (Cu) and titanium (Ti), a laminated layer of aluminum (Al) and molybdenum (Mo), a laminated layer of molybdenum (Mo) and tantalum (Ta), a laminated layer of molybdenum (Mo) and tungsten (W), or a laminated layer of molybdenum (Mo)-aluminum (Al)-molybdenum (Mo). Optionally, the light-shielding layer LS can include a light-shielding metal layer, diffusion barrier layer, and an etch barrier layer disposed in a stack. A material of the light-shielding metal layer can be a laminated layer of Mo/Cu. A material of the diffusion barrier layer can be MoTi, Mo, Ta and other materials which work functions are similar to that of Cu. A material of the etch barrier layer can be metal oxides such as indium tin oxide (ITO), indium gallium zinc oxide (IGZO), etc.

The buffer layer BL is configured to prevent a metal of the light-shielding layer LS from entering the active layer CL of the thin film transistor T in the thin film transistor layer 20. Optionally, a material of the buffer layer BL is selected from one of laminated layers of silicon oxide, nitrogen oxide, silicon oxynitride and silicon oxide, nitrogen oxide, or silicon oxynitride.

The thin film transistor layer 20 is disposed on the substrate 10. The thin film transistor layer 20 includes a pixel driving circuit for driving sub-pixels of the organic light-emitting diode display panel 100 to emit light. The pixel driving circuit can be 2-transistor-1-capacitor (2T1C), 3-transistor-1-capacitor (3T1C), 5-transistor-1-capacitor (5T1C), 7-transistor-1-capacitor (7T1C), or other pixel driving circuits generally used in the art. Specifically, the thin film transistor layer 20 includes a plurality of thin film transistor layers T. The plurality of thin film transistors T can be divided into driving transistors, switching transistors, etc., according to their functions in the pixel circuit. It should be noted that in FIG. 1, only a complete structure of one thin film transistor T of the pixel circuit is illustrated, and some parts of the pixel circuit are omitted.

The thin film transistor T is located in the display region AA. The thin film transistor layer T includes the active layer CL, a gate insulation layer GI, a gate electrode GE, an interlayer insulation layer IL, a source electrode SE, and a drain electrode DE sequentially stacked on the buffer layer BL. Specifically, the active layer CL is located on a surface of the buffer layer BL away from the substrate 10. The active layer CL includes a channel region, and a source electrode region and a drain electrode region located on two sides of the channel region. The gate insulation layer GI is disposed on the channel region. The gate electrode GE is disposed on the gate insulation layer GI. The interlayer insulation layer IL covers the gate electrode GE and the active layer CL. The source electrode SE and the drain electrode DE are located on the interlayer insulation layer IL. The source electrode SE and the drain electrode DE are respectively disposed corresponding to a source electrode region and a drain electrode region of the active layer CL, and are respectively connected to the source electrode region and the drain electrode region of the active layer CL through via holes defined in the interlayer insulating layer IL.

The thin film transistor layer 20 further includes an auxiliary cathode 21. The auxiliary cathode 21 is disposed in a same layer with the source electrode SE and the drain electrode DE of the thin film transistor. It can be understood that the source electrode SE, the drain electrode DE, and the auxiliary cathode 21 can be manufactured by a same material in a same process. Optionally, the auxiliary cathode 21 includes a conductive metal layer and a protection metal layer disposed in a stack. The conductive metal layer is disposed between the protection metal layer and the substrate 10. A material of the protection metal layer is resistant to corrosion of hydrofluoric acid and is configured to protect the auxiliary cathode 21 from corrosion of an etching solution used in a process for defining a hole. In one specific embodiment, a material of the auxiliary cathode 21 is a laminated metal of MoTi/Cu/MoTi. The MoTi located at top is a protection metal layer, the Cu at middle is a conductive metal layer, and the MoTi at bottom serves a barrier effect. The thin film transistor layer 20 further includes a peripheral circuit terminal 22. The peripheral circuit terminal 22 is disposed in a same layer with the source electrode SE and the drain electrode DE of the thin film transistor, but is located in the non-display region AA.

The passivation layer 30 covers a side of the thin film transistor layer 20 away from the substrate 10 to serve an effect of protecting the thin film transistor layer 20. The passivation layer 30 includes a first passivation layer 31 and a second passivation layer 32. The second passivation layer 32 is located on a side of the first passivation layer 31 away from the thin film transistor layer 20. A first through hole 31a is defined in the first passivation layer 31. A second through hole 32a is defined in the second passivation layer 32. The first through hole 31a communicates with the second through hole 32a. The first through hole 31a and the second through hole 32a constitute an undercut structure 30a. A depth of the undercut structure 30a is greater than 0.2 μm. The undercut structure 30a exposes the auxiliary cathode 21.

In order to form the undercut structure 30a in the passivation layer 30, when the first passivation layer 31 and the second passivation layer 32 are simultaneously etched by using a same etching solution or etching gas, an etching rate of the first passivation layer 31 etched by the etching solution or the etching gas is greater than the etching rate of the second passivation layer 32. Optionally, a material of the first passivation layer 31 includes silicon oxide, and a material of the second passivation layer 32 includes silicon nitride. The etching solution includes hydrofluoric acid. In a more specific embodiment, the first passivation layer 31 is constituted by silicon oxide, and the second passivation layer 32 is constituted by silicon nitride. The etching solution is hydrofluoric acid.

The planarization layer 40 is dispose on a side of the passivation layer 30 away from the thin film transistor layer 20. The planarization layer 40 is used to form a flat topography, so as to facilitate forming an organic light-emitting diode device on the thin film transistor layer 20 in subsequence. A third through hole 40a is defined in the planarization layer 40. The third through hole 40a communicates with the second through hole 32a. The first through hole 31a, the second through hole 32a, and the third through hole 40a constitute an auxiliary cathode connection hole VA. Optionally, a material of the planarization layer 40 is an organic material, and specifically, it can be selected from one of acrylic resins, epoxy resins, or perfluoroalkoxy resins (PFA).

The organic light-emitting layer 50 is disposed on the planarization layer 40. The organic light-emitting layer 50 includes a plurality of organic light emitting devices. Optionally, the plurality of organic light emitting devices are arranged into a matrix shape. The organic light-emitting layer 50 includes an anode 51, a pixel definition layer (PDL) 52, a hole inject layer (HIL) 53, a hole transfer layer (HTL) 54, an emitting layer (EML) 55, an electron transfer layer (ETL) 56, an electron inject layer (EIL) 57, and a cathode 58 sequentially disposed in a stack. Wherein, the anode 51, the hole inject layer 53, the hole transfer layer 54, the emitting layer 55, the electron transfer layer 56, the electron inject layer 57, and the cathode 58 constitute one organic light-emitting device.

Figure 2:
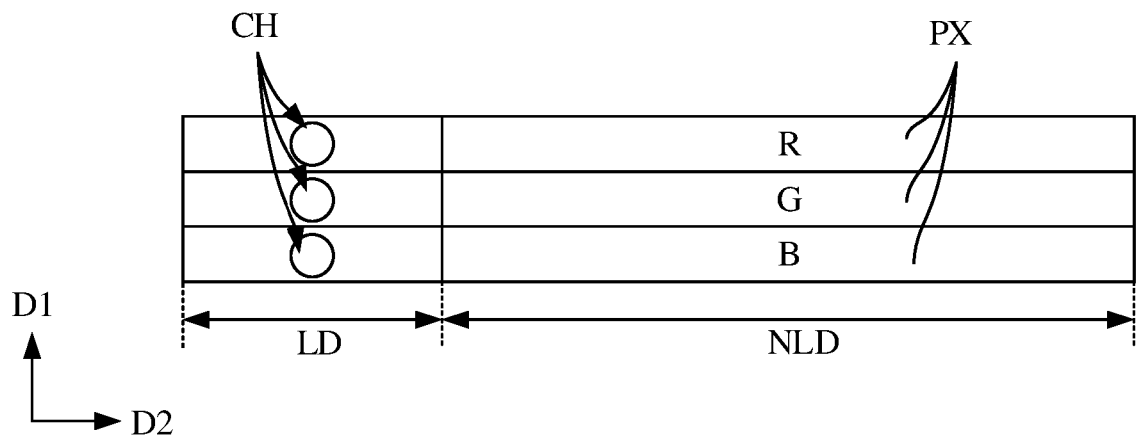
FIG. 2 is a top view of a sub-pixel and auxiliary cathode connection holes of the display panel of FIG. 1.

Please refer to FIG. 2. From the top view, the organic light-emitting diode display panel 100 includes a plurality of sub-pixels PX arranged in an array manner. FIG. 2 shows a red sub-pixel PX1, a green sub-pixel PX2, and a blue sub-pixel PX3. The red sub-pixel PX1, the green sub-pixel PX2, and the blue sub-pixel PX3 are arranged along a first direction D1, and the red sub-pixel PX1, the green sub-pixel PX2, and the blue sub-pixel PX3 respectively extend along a second direction D2 intersecting with the first direction D1. Optionally, the first direction D1 is perpendicular to the second direction D2. A light-emitting region LD and a non-light-emitting region NLD are divided in each of the sub-pixels PX. The light-emitting region LD refers to a region where organic light emitting devices are disposed. The non-light-emitting region NLD is a region except the light-emitting region LD. The light-emitting region LD and the non-light-emitting region NLD are arranged in the second direction D2. The auxiliary cathode connection hole VA is defined in the non-light-emitting region NLD, i.e., the auxiliary cathode connection hole VA is located on a side of the organic light-emitting device in the second direction D2.

The organic light-emitting layer 50 includes plurality of anodes 51 disposed on the planarization layer 40. The plurality of anodes are disposed spaced apart and isolated to each other on the planarization layer 40. Each anode 51 is connected to the drain DE of one thin film transistor T through a first contact hole CH1 formed in the planarization layer 40 and the passivation layer 30. A material of the anodes 51 can include one or more of indium tin oxide (ITO), indium zinc oxide (IZO), silver (Ag), palladium (Pd), copper (Cu), aluminum (Al), nickel (Ni), or lanthanum (La). The anodes 51 can be a single-layer structure, a double-layer structure, or a triple-layer structure. Optionally, the anodes 51 are a laminated structure of ITO/Ag/ITO. In addition, the organic light-emitting diode display panel 100 further includes a terminal section PAD. The terminal section PAD is disposed in a same layer with the anodes 51 and is connected to the peripheral circuit terminal 22 through a second contact hole CH2 defined in the passivation layer 30.

The pixel definition layer 52 covers the plurality of anodes 51 and the planarization layer 40. A plurality of openings 52a are defined in the pixel definition layer 52. The hole inject layer 53, the hole transfer layer 54, the emitting layer 55 are sequentially disposed in a stack in each opening 52a. The electron transfer layer 56, the electron inject layer 57, and the cathode 58 sequentially cover the emitting layer 55 and the pixel definition layer 52.

Both the electron transfer layer 56 and the electron inject layer 57 can be referred to as electronic functional layers. Due to manufacturing processes, when evaporation deposition is performed on the electron transfer layer 56 and the electron inject layer 57, the electron transfer layer 56 and the electron inject layer 57 can enter the first through hole 31a to connect to the auxiliary cathode 21. However, as the electron transfer layer 56 and the electron inject layer 57 are not conductive, which can hinder conduction between the cathode 58 and the auxiliary cathode 21. In the present application, by using the second passivation layer 32 to form a protruding structure, during the evaporation deposition, the materials of the electron transfer layer 56 and the electron inject layer 57 are shielded, so that a circle of space around the electron transfer layer 56 and/or the electron inject layer 57 formed in the undercut structure 30a is reserved. When the cathode 58 is subsequently evaporated and deposited, due to material properties of the cathode 58, the cathode 58 can extend along the lateral walls of the third through hole 40a, the second through hole 32a and the first through hole 31a and occupies the reserved space around the electron transfer layer 56 and the electron inject layer 57 in the undercut structure 30a, thereby connecting to the auxiliary cathode 21. In other words, the electronic functional layer includes a first part P1 and a second part P2. The first part P1 is located in the light-emitting region LD, and the second part P2 is located in the non-light-emitting region NLD Furthermore, the first part P1 is located on a side of the cathode 58 away from the passivation layer 30, and the second part P2 is located on the auxiliary cathode 21 in the undercut structure 30a. Specifically, the cathode 58 is located between the second part P2 and a lateral wall of the undercut structure 30a, and is connected to the auxiliary cathode 21. In other word, the cathode 58 extends along a lateral wall of the auxiliary cathode connection hole VA, and occupies the reserved space around the electronic functional layer in the undercut structure 30a, thereby connecting to the auxiliary cathode 21. Optionally, a material of the cathode 52 can be selected from aluminum (Al), gold (Au), or silver (Ag), etc.

In the present application, by forming the undercut structure 30a in the passivation layer 30, the electronic functional layer hindering the connection between the cathode 58 and the auxiliary cathode 21 can be prevented, connection performance between the cathode 58 and the auxiliary cathode 21 can be improved, the voltage drop can be reduced, and display quality can be improved. In addition, in the present application, there is no need to additionally add film layers to manufacture the undercut structure 30a, the process is simple, and the cost is low.

The present application further provides a manufacturing method of the organic light-emitting diode display panel, which is configured to manufacturing method the aforesaid organic light-emitting diode display panel. The manufacturing method of the organic light-emitting diode display panel includes following steps:

providing a substrate;
forming a thin film transistor layer on the substrate, wherein the thin film transistor layer includes a source electrode, a drain electrode, and an auxiliary cathode, and the auxiliary cathode is disposed in a same layer with the source electrode and the drain electrode;
forming a passivation layer on the thin film transistor layer, wherein the passivation layer includes a first passivation layer and a second passivation layer. the second passivation layer is located on a side of the first passivation layer away from the thin film transistor layer;
using an etching solution to etch the first passivation layer and the second passivation layer to form an undercut structure, wherein an etching rate of the etching solution to the first passivation layer is greater an etching rate of the etching solution to the second passivation layer, and the undercut structure exposes the auxiliary cathode; and
forming a cathode on the passivation layer, wherein the cathode extends into the undercut structure and is connected to the auxiliary cathode.

In the present application, by using two different materials to form the passivation layers, then, by using the etching solution with different etching rates for the two different materials to form the undercut structure in the passivation layers, the electronic functional layer hindering the connection between the cathode and the auxiliary cathode can be prevented, connection performance between the cathode and the auxiliary cathode can be improved, the voltage drop can be reduced, and display quality can be improved. In addition, in the present application, there is no need to additionally add film layers to manufacture the undercut structure, the process is simple, and the cost is low. Hereinafter, two specific embodiments are taken to describe the manufacturing method of the organic light-emitting diode display panel of the present application.

Please refer to FIG. 3(a) to FIG. 3(k). A first embodiment of the manufacturing method of the organic light-emitting diode display panel of the present application includes following steps.

Figure 3A:
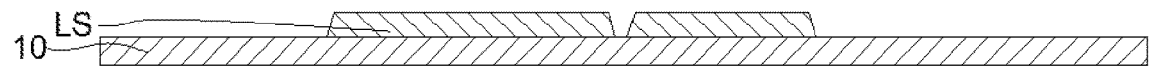
FIGS. 3(a)-(l) are schematic diagrams of steps of a first embodiment of a manufacturing method of the display panel of the present application.

Please refer to FIG. 3(a). 101: providing a substrate 10, and forming a light-shielding layer LS on the substrate 10.

The step 101 specifically includes: depositing a MiTi/Cu metal layer on a glass substrate 10 by physical vapor sputtering manner, and etching with $H_2O_2$ to form a patterned light-shielding layer LS.

Figure 3B:
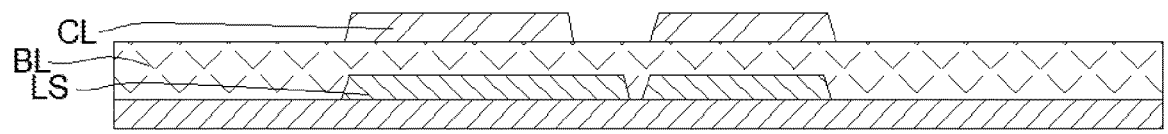
Figure 3C:
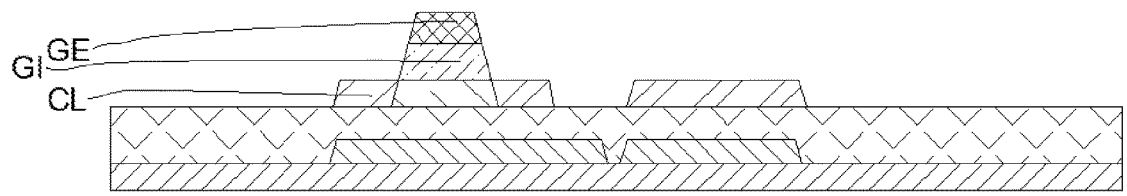
Figure 3D:
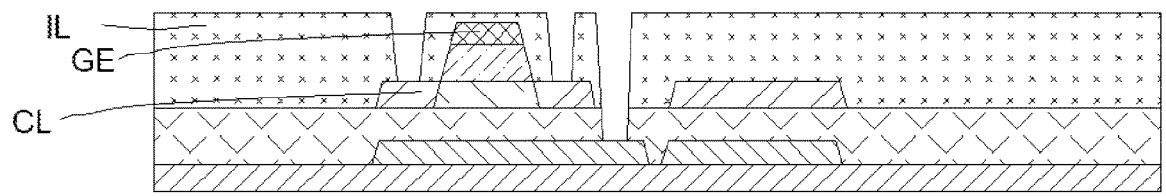

Please refer to FIG. 3(b). 102: forming a buffer layer BL on the light-shielding layer LS.

The step 102 specifically includes: depositing the buffer layer BL on the light-shielding layer LS by using a chemical vapor method. A material of the buffer layer BL can be silicon oxide or silicon nitride.

Please refer to FIG. 3(b) to FIG. 3(e). 103: forming a thin film transistor layer 20 on the buffer layer BL.

The step 103 specifically includes:

1031: forming an active layer CL on the buffer layer BL.

In the step 1031, a semiconductor material layer is formed on the buffer layer BL by the physical vapor sputtering deposition manner, The active layer CL pattern is formed by a photolithography process. The semiconductor material can be a metal oxide semiconductor such as indium tin oxide (ITO) or indium gallium zinc oxide (IGZO) or a silicon-based semiconductor. Optionally, the semiconductor material is IGZO, and an oxalic acid-based chemical solution can be used in the etching solution.

1032: forming a gate insulation layer GI and a gate electrode GE on the active layer CL.

In the step 1032, the gate insulation material layer and the first metal layer are deposited by the chemical vapor method, and the gate insulation layer GI and the gate electrode GE are formed by a photolithography process. After a photoresist is peeled off, the gate electrode GE is used as a shield, and conductorization of the IGZO is made by plasma treatment.

1033: forming an interlayer insulation layer IL on the gate electrode GE and the active layer CL.

In the step 1033, the interlayer insulation layer IL is deposited by the chemical vapor method, holes are respectively defined in the interlayer insulation layer IL and the buffer layer BL by two photolithography processes, and contact holes between the source electrode SE and the drain electrode DE, and the active layer CL, and contact holes between the drain electrode DE and the light-shielding layer LS are formed. The hole can be defined by dry etching with oxidized gas such as F-block element oxidized gas.

1034: forming a source electrode SE, a drain electrode DE, an auxiliary cathode 21 and a peripheral circuit terminal 22 on the interlayer insulation layer IL.

In the step 1034, a second metal layer can be deposited. Then the second metal layer is patterned to form the source electrode SE, the drain electrode DE, and the auxiliary cathode 21. Wherein, the auxiliary cathode 21 includes a conductive metal layer and a protection metal layer disposed in a stack. The conductive metal layer is disposed between the protection metal layer and the substrate 10 to protect a material of the metal layer from corrosion of hydrofluoric acid.

In the step 1034, a MoTi/Cu/MoTi metal layer is deposited by the physical vapor method, and the source electrode SE, the drain electrode DE, the auxiliary cathode 21 and a peripheral circuit terminal 22 are formed by photolithography processes, and the etching solution used in the photolithography processes is $H_2O_2$ series etching solution.

Figure 3E:
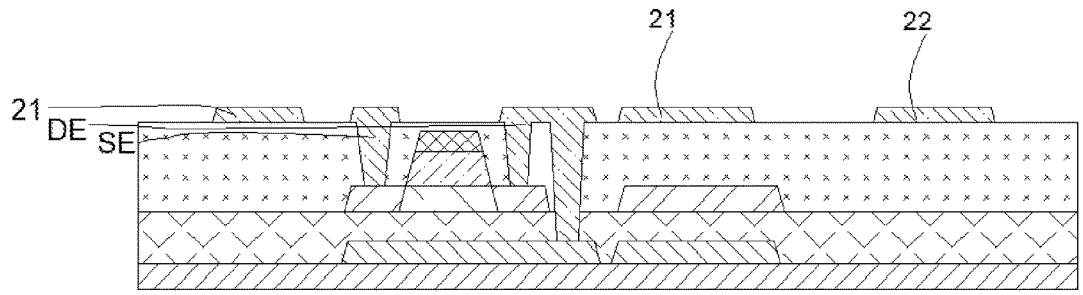
Figure 3F:
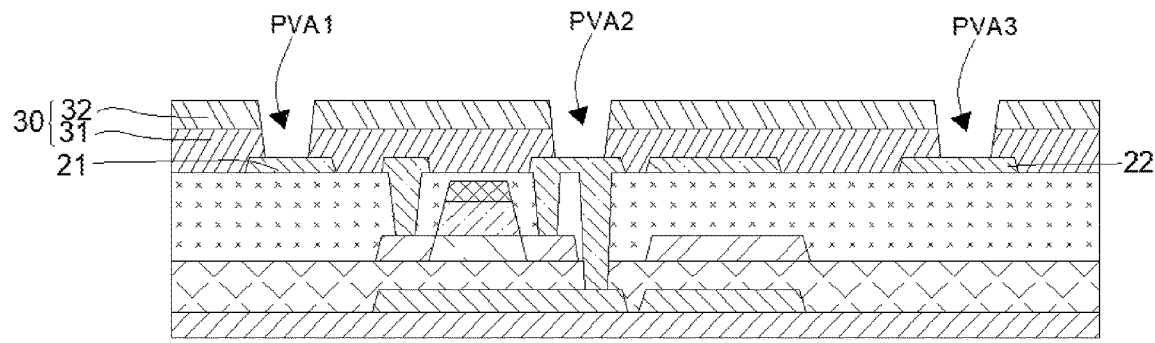

Please refer to FIG. 3(e) to FIG. 3(f). 104: forming a passivation layer 30 on the thin film transistor layer 20, wherein, the passivation layer 30 includes a first passivation layer 31 and a second passivation layer 32, and the second passivation layer 32 is located on a side of the first passivation layer 31 away from the thin film transistor layer 20;

using an etching gas to simultaneously etch the first passivation layer 31 and the second passivation layer

32 to form a first prefabricated hole PVA1 in the first passivation layer 31, wherein the first prefabricated hole PVA1 penetrates through the first passivation layer 31 and the second passivation layer 32 and exposes the auxiliary cathode 21; and forming a second prefabricated hole PVA2 on the thin film transistor layer 20 to expose the drain electrode DE of the thin film transistor layer 20; while simultaneously forming a third prefabricated hole PVA3 on the peripheral circuit terminal 22 to expose the peripheral circuit terminal 22.

In the step 104, a layer of silicon oxide and a layer of silicon nitride are deposited by the chemical vapor method on the interlayer insulation layer IL, the source electrode SE, the drain electrode DE, the auxiliary cathode 21 and the peripheral circuit terminal 22, a pattern of the passivation protection layer is formed by a photolithography process, oxidized gas such as F-block element gas is used as dry etchant, and preliminary etching is completed to obtain the first prefabricated hole PVA1.

Figure 3G:
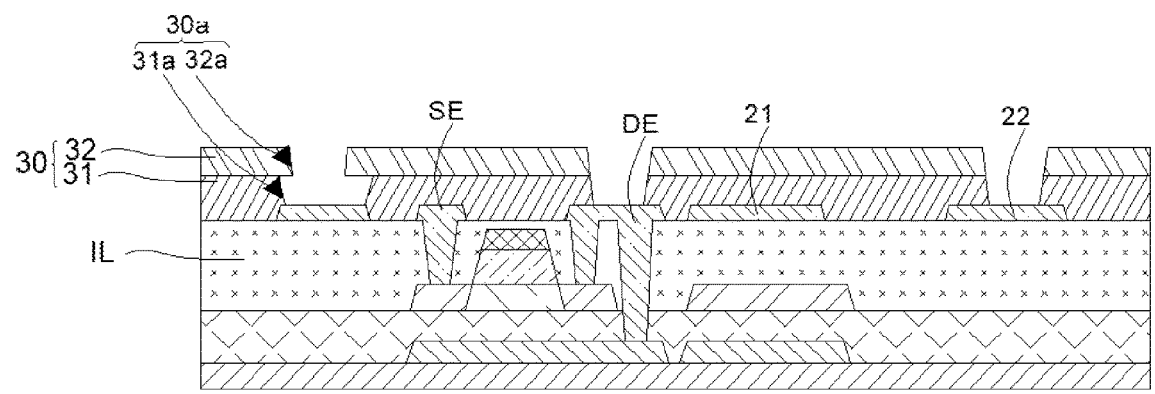
Figure 3H:
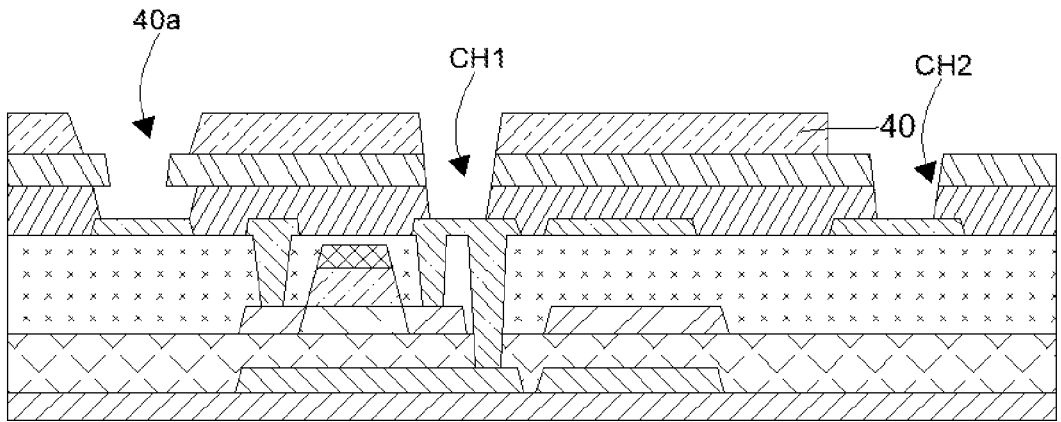

Please refer to FIG. 3(f) to FIG. 3(h). 105: using an etching solution to etch the first passivation layer 31 and the second passivation layer 32 to form an undercut structure 30a at the first prefabricated hole PVA1, wherein an etching rate of the etching solution to the first passivation layer 31 is greater an etching rate of the etching solution to the second passivation layer 32.

Optionally, the first passivation layer 31 includes silicon oxide, the second passivation layer 32 includes silicon nitride, the etching solution is hydrofluoric acid, and an etching rate ratio of the etching solution of silicon oxide to silicon nitride is greater than or equal to 10. Optionally, the passivation layer 31 is silicon oxide, the second passivation layer 32 is silicon nitride, the etching solution is hydrofluoric acid, and an etching rate ratio of the etching solution of silicon oxide to silicon nitride is greater than or equal to 10. Because the auxiliary cathode 21 has a protection metal layer that is resistant to corrosion by hydrofluoric acid, the auxiliary cathode 21 is not damaged when the undercut structure 30a is etched.

It can be understood that the passivation layer 30 can further be a laminated layer of SiN/SiO$_2$/SiN, and the undercut structure 30a is formed on SiO$_2$ and SiN on the SiO$_2$.

On the basis of the first prefabricated hole PVA1, photolithography is performed to define holes, and hydrofluoric (HF) wet etching solution is used to etch holes to complete the manufacture of the undercut structure 30a. The SiO$_2$/SiN etching rate ratio of the passivation (PV) film quality can be adjusted up to more than 10.

Please refer to FIG. 3(g) to FIG. 3(h). 106: forming a planarization layer 40 on the passivation layer 30, and removing the organic planarization layer 40 of the non-display region NA; forming a third via hole 40 a in the planarization layer 40, wherein the third through hole 40a communicates with the second through hole 32a, and the first through hole 31a, the second through hole 32a, and the third through hole 40a constitute an auxiliary cathode connection hole VA; while simultaneously forming through holes respectively in the planarization layer 40 above the second prefabricated hole PVA2 and the third prefabricated hole PVA3 to form the first contact hole CH1 and the second contact hole CH2.

Figure 3I:
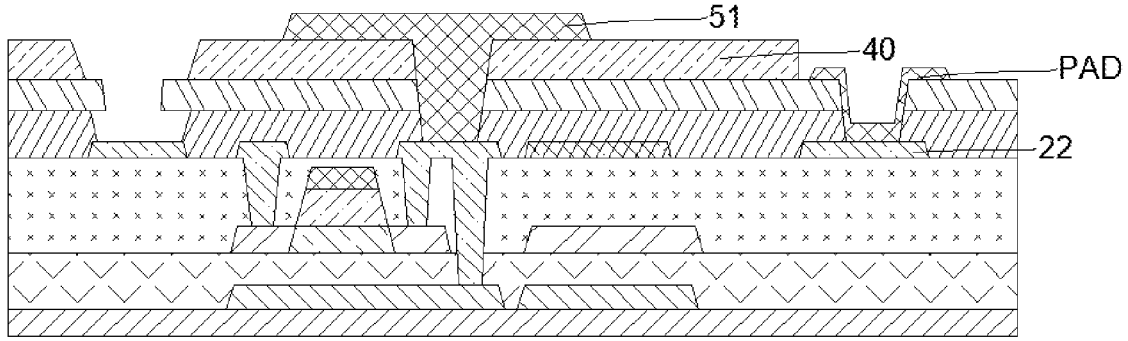

Please refer to FIG. 3(h) to FIG. 3(i). 107: forming an anode 51 and a terminal section PAD on the planarization layer 40.

The anode 51 and the terminal section PAD are formed by physical vapor deposition, exposure, development, and wet etching. The anode 51 is connected to the drain electrode DE through the first contact hole CH1. The terminal section PAD is connected to the peripheral circuit terminal 22 through the second contact hole CH2.

Figure 3J:
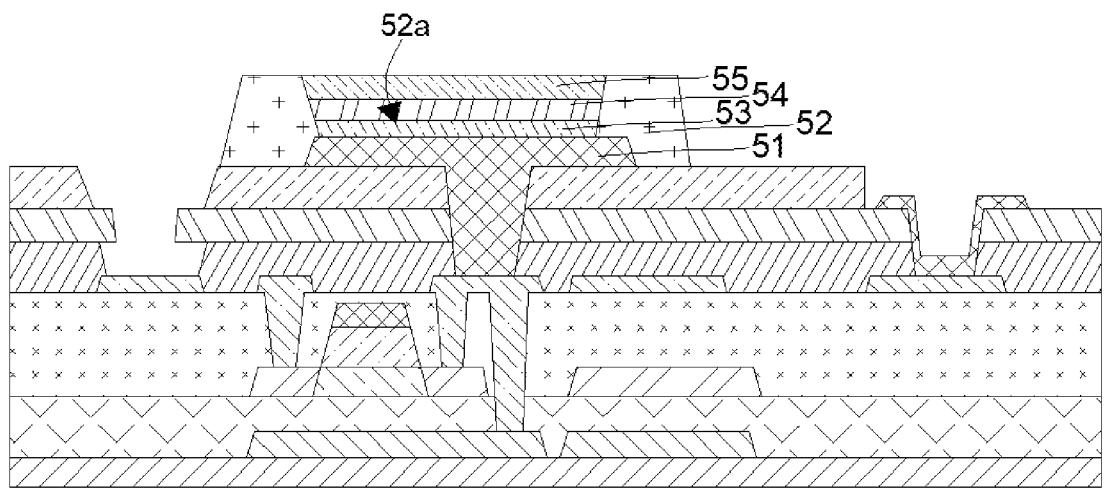

Please refer to FIG. 3(i) to FIG. 3(j). 108: forming a pixel definition layer 52 on the anode 51, wherein a plurality of openings 52a are defined in the pixel definition layer 52.

Figure 3K:
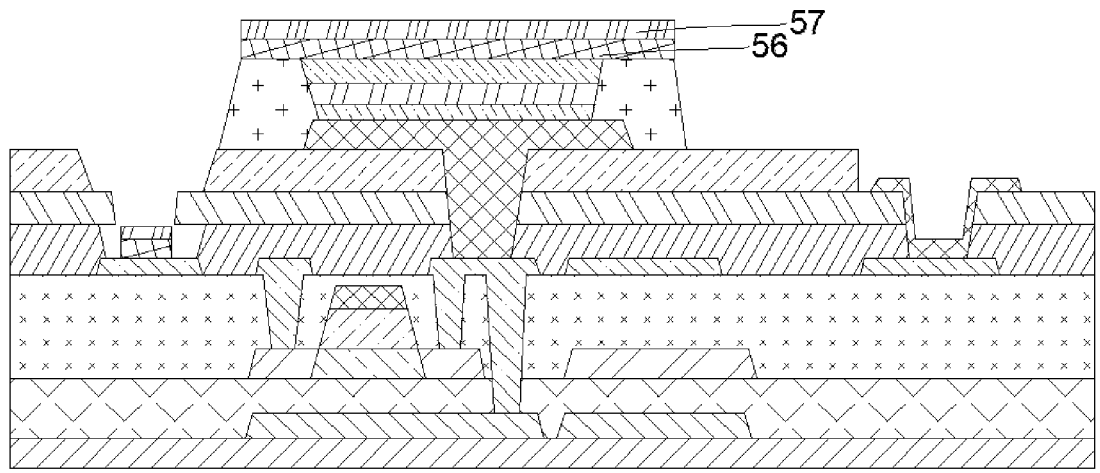
Figure 3L:
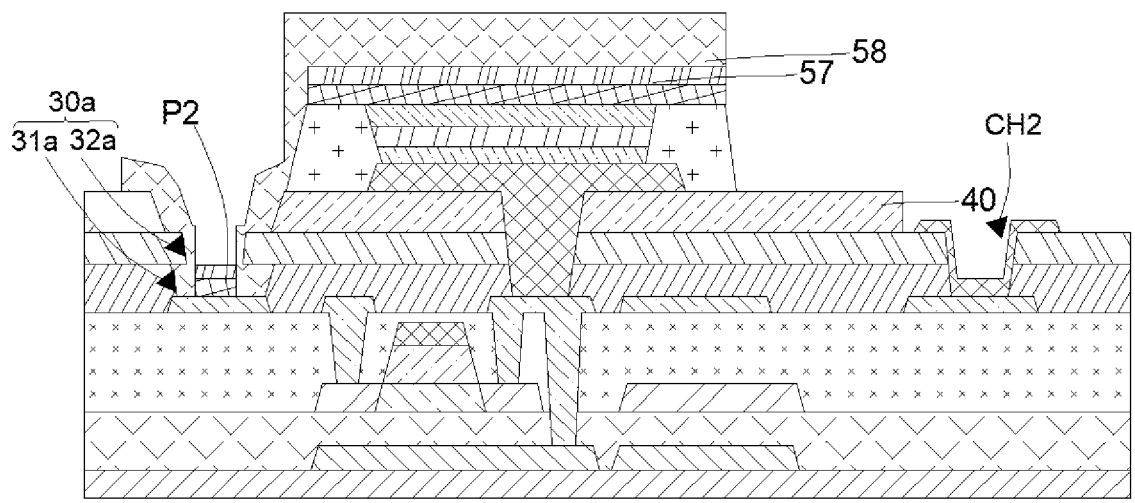

Please refer to FIG. 3(j) to FIG. 3(k). 109: forming a hole inject layer 53, a hole transfer layer 54, and an emitting layer 55 in an opening 52a of the pixel definition layer 52, and evaporating and depositing the electron transfer layer 56 and the electron inject layer 57 on the pixel definition layer 52 and the emitting layer 55.

In the step 109, the first part P1 of the electron transfer layer 56 and the electron inject layer 57 is located on a side of the anode 51 away from the passivation layer 30 and above the thin film transistor T, and the second part P2 is located on the auxiliary cathode 21 in the undercut structure 30a. Because the protruding structure is formed by using the second passivation layer 32, during evaporation deposition, the materials of the electron transfer layer 56 and the electron inject layer 57 are shielded. Therefore, a circle of space around the electron transfer layer 56 and/or the electron inject layer 57 formed in the undercut structure 30a is reserved.

Please refer to FIG. 3(I). 110: forming a cathode 58 on the electron inject layer 57, wherein the cathode 58 extends into the undercut structure 30a and is connected to the auxiliary cathode 21.

In the step 110, the cathode 58 is formed by a sputtering deposition manner. When the cathode 58 is evaporated and deposited, due to material properties of the cathode 58, the cathode 58 can extend along the lateral walls of the third through hole 40a, the second through hole 32a, and the first through hole 31a and occupies the reserved space around the electron transfer layer 56 and the electron inject layer 57 in the undercut structure 30a, thereby connecting to the auxiliary cathode 21.

In this embodiment, the undercut structure 30a is formed in the passivation layer 30 by using etching solutions with different etching rates for two different materials, then the planarization layer 40 is formed, and the process is simple.

Figure 4A:
FIGS. 4(a)-(m) are schematic diagrams of steps of a second embodiment of the manufacturing method of the display panel of the present application.

Please refer to FIG. 4(a) to FIG. 4(m). A second embodiment of the manufacturing method of the organic light-emitting diode display panel of the present application includes following steps:

Please refer to FIG. 4(a). 201: providing a substrate 10, and forming a light-shielding layer LS on the substrate 10.

The step 201 specifically includes: depositing a light-shielding metal layer on the glass substrate 10 by a physical vapor sputtering manner, then depositing a diffusion barrier layer and an etch barrier layer on the light-shielding metal layer by a physical vapor deposition (PVD) manner, and forming a patterned light-shielding layer LS by a photolithography process. A material of the light-shielding metal layer can be a laminated layer of Mo/Cu. A material of the diffusion barrier layer can be MoTi, Mo, Ta and other materials which work functions are similar to that of Cu. A material of the etch barrier layer can be metal oxides such as indium tin oxide (ITO), indium gallium zinc oxide (IGZO), etc. A H$_2$O$_2$-based chemical solution can be used as an etching solution in the light-shielding metal layer and the diffusion barrier layer. Oxalic acid chemical solution can be used as an etching solution in the etch barrier layer.

Figure 4B:
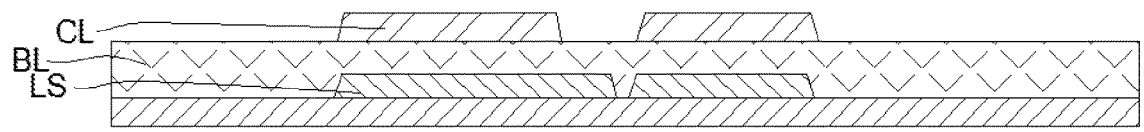
Figure 4C:
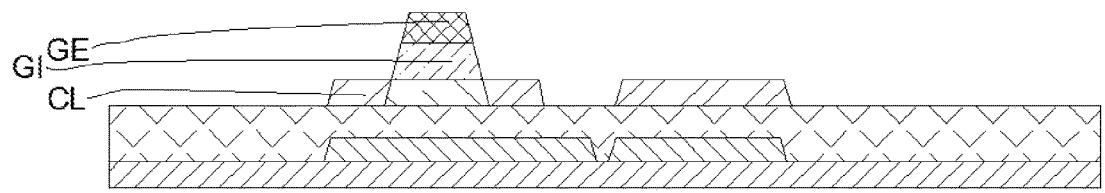
Figure 4D:
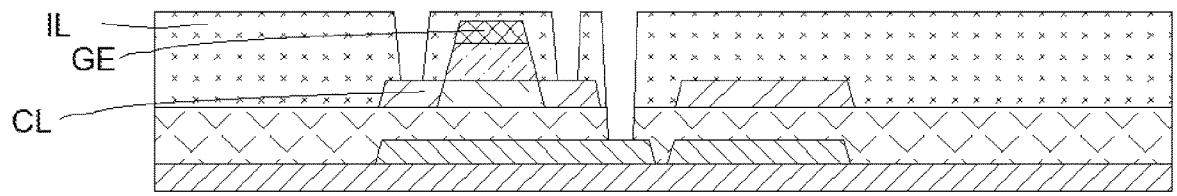

Please refer to FIGS. 4(a) to 4(b). 202: forming a buffer layer BL on the light-shielding layer LS.

The step 202 specifically includes: depositing the buffer layer BL on the light-shielding layer LS by using a chemical vapor method. The buffer layer BL can be silicon oxide or silicon nitride. When the etch barrier layer is IGZO, plasma treatment needs be used simultaneously to perform the conductorization on the etch barrier layer to ensure that charges of a subsequent source electrode and the light shielding layer LS are transferred to each other to compensate a threshold voltage Vth.

Please refer to FIG. 4(b) to FIG. 4(e). 203: forming a thin film transistor layer 20 on the buffer layer BL.

The step 203 specifically includes:

2031: forming an active layer CL on the buffer layer BL.

In the step 2031, a semiconductor material layer is formed on the buffer layer BL by the physical vapor sputtering deposition manner, The active layer CL pattern is formed by a photolithography process. The semiconductor material can be a metal oxide semiconductor such as indium tin oxide (ITO) or indium gallium zinc oxide (IGZO) or a silicon-based semiconductor. Optionally, the semiconductor material is IGZO, and an oxalic acid-based chemical solution can be used in the etching solution.

2032: forming a gate insulation layer GI and a gate electrode GE on the active layer CL.

In the step 2032, the gate insulation material layer and the first metal layer are deposited by the chemical vapor method, and the gate insulation layer GI and the gate electrode GE are formed by a photolithography process. After a photoresist is peeled off, the gate electrode is used as a shield, and conductorization of the IGZO is made by plasma treatment.

2033: forming an interlayer insulation layer IL on the gate electrode and the active layer CL.

In the step 2033, the interlayer insulation layer IL is deposited by the chemical vapor method, and holes are respectively defined in the interlayer insulation layer IL and the buffer layer BL by two photolithography processes. Contact holes between the source electrode SE and the drain electrode DE, and the active layer CL, and contact holes between the drain electrode DE and the light-shielding layer LS are formed. The hole can be performed by dry etching with oxidized gas such as F-block element oxidized gas.

2034: forming a source electrode SE, a drain electrode DE, an auxiliary cathode 21 and a peripheral circuit terminal 22 on the interlayer insulation layer IL.

In the step 2034, a second metal layer can be deposited. Then the second metal layer is patterned to form the source electrode SE, the drain electrode DE, the auxiliary cathode 21, and the peripheral circuit terminal 22. Wherein, the auxiliary cathode 21 includes a conductive metal layer and a protection metal layer disposed in a stack. The conductive metal layer is disposed between the protection metal layer and the substrate 10 to protect a material of the metal layer from corrosion of hydrofluoric acid.

In the step 2034, a MoTi/Cu/MoTi metal layer is deposited by the physical vapor method, and the source electrode SE, the drain electrode DE, the auxiliary cathode 21 and the peripheral circuit terminal 22 are formed by photolithography processes, and the etching solution used in the photolithography processes is $H_2O_2$ series etching solution.

Figure 4E:
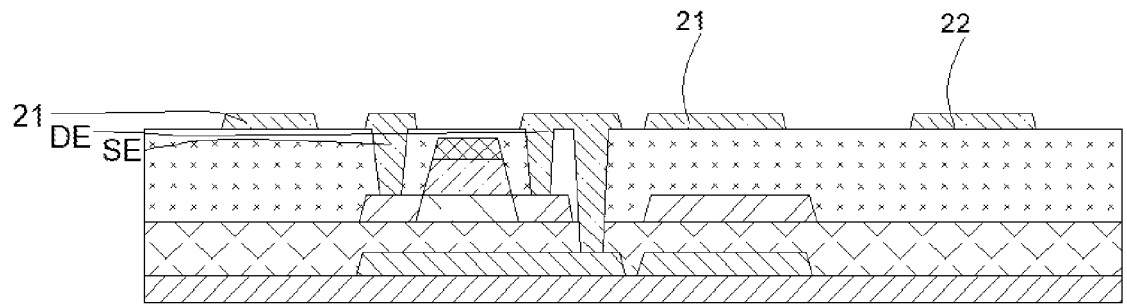
Figure 4F:
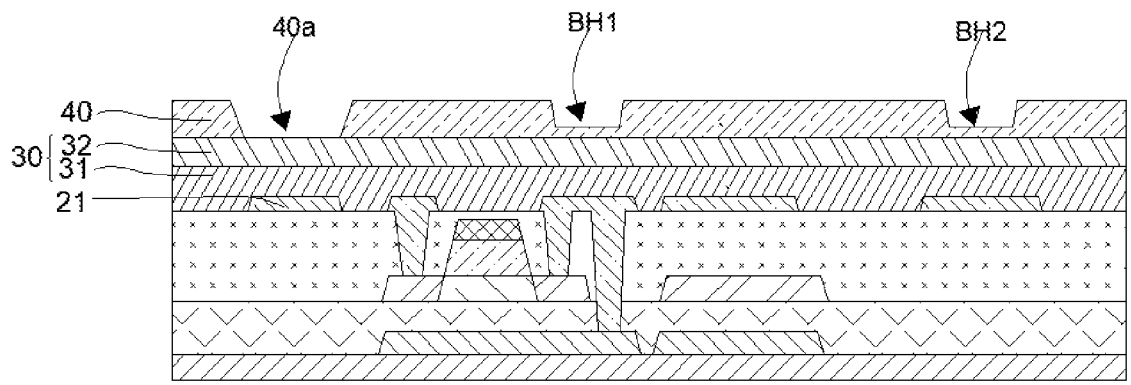

Please refer to FIG. 4(e) to FIG. 4(f). 204: forming a passivation layer 30 on the thin film transistor layer 20, wherein, the passivation layer 30 includes a first passivation layer 31 and a second passivation layer 32, and The second passivation layer 32 is located on a side of the first passivation layer 31 away from the thin film transistor layer 20.

205: forming a planarization layer 40 on the passivation layer 30.

206: using a halftone mask to pattern the planarization layer 40 to remove the organic planarization layer 40 in the non-display region, and forming a third through hole 40a, a first blind via BH1 (half opening), a second blind via BH2 (half opening) in the planarization layer 40. The third through hole 40a corresponds to the auxiliary electrode, and the first blind hole BH1 corresponds to the drain electrode DE of the thin film transistor T. The second blind hole BH2 corresponds to the peripheral circuit terminal 22. An organic photoresist ranging from 0.2 μm to 1 μm is reserved in both the first blind hole BH1 and the second blind hole BH2 to prevent the source electrode from being etched when the undercut structure 30a is subsequently etched.

Figure 4G:
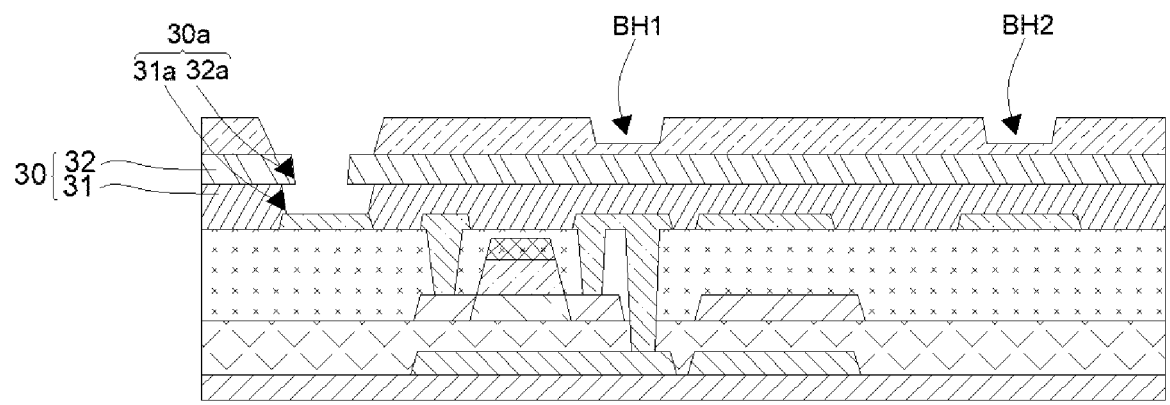

Please refer to FIG. 4(f) to FIG. 4(g). 207: using an etching solution to etch the first passivation layer 31 and the second passivation layer 32 at the third through hole 40a to form a first through hole 31a in the first passivation layer 31; and forming a second through hole 32a in the second passivation layer 32, wherein the first through hole 31a and the second through hole 32a communicate with each other and constitute the undercut structure 30a; and wherein an etching rate of the etching solution to the first passivation layer 31 is greater an etching rate of the etching solution to the second passivation layer 32.

Optionally, the first passivation layer 31 includes silicon oxide, the second passivation layer 32 includes silicon nitride, the etching solution is hydrofluoric acid, and an etching rate ratio of the etching solution of silicon oxide to silicon nitride is greater than or equal to 10. Optionally, the passivation layer 31 is silicon oxide, the second passivation layer 32 is silicon nitride, the etching solution is hydrofluoric acid, and an etching rate ratio of the etching solution of silicon oxide to silicon nitride is greater than or equal to 10. Because the auxiliary cathode 21 has a protection metal layer that is resistant to corrosion by hydrofluoric acid, the auxiliary cathode 21 is not damaged when the undercut structure 30a is etched.

Figure 4H:
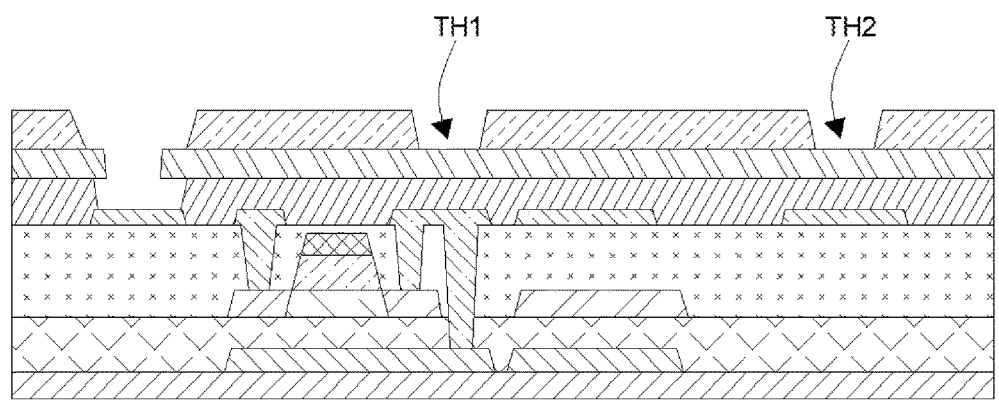

Please refer to FIG. 4(g) to FIG. 4(h). 208: performing dry etching at the first blind via BH1 to form a fourth through hole TH1 from the first blind via, and to form the fifth through hole TH2 from the second blind hole BH2.

In the step 208, by using the dry etching process and by using $O_2$, the first blind hole BH1 and the second blind hole BH2 are all opened to complete the openings of the planarization layer 40 on the passivation layer 30.

Figure 4I:
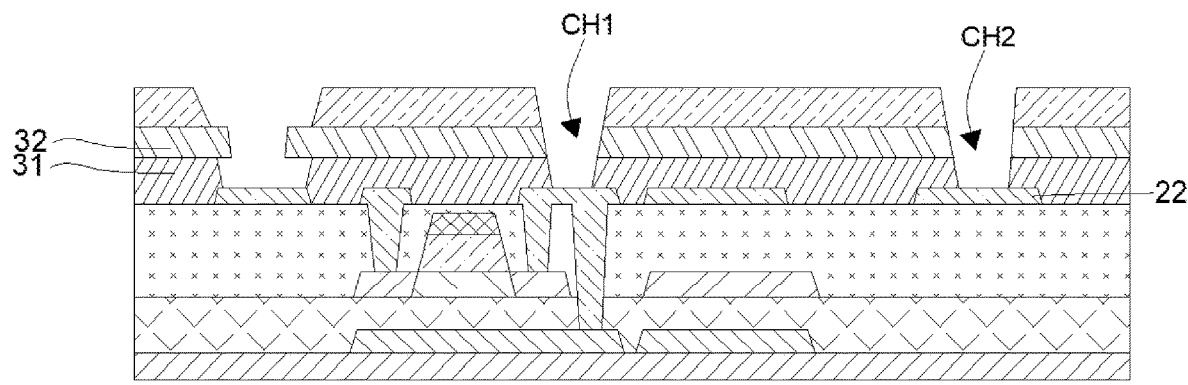

Please refer to FIG. 4(h) to FIG. 4(i). 209: etching the first passivation layer 31 and the second passivation layer 32 at the fourth through hole TH1 and the fifth through hole TH2 to respectively form a first contact hole CH1 and a second contact hole CH2.

In the step 209, by using the dry etching process, the opening of the passivation layer 30 is completed.

Figure 4J:
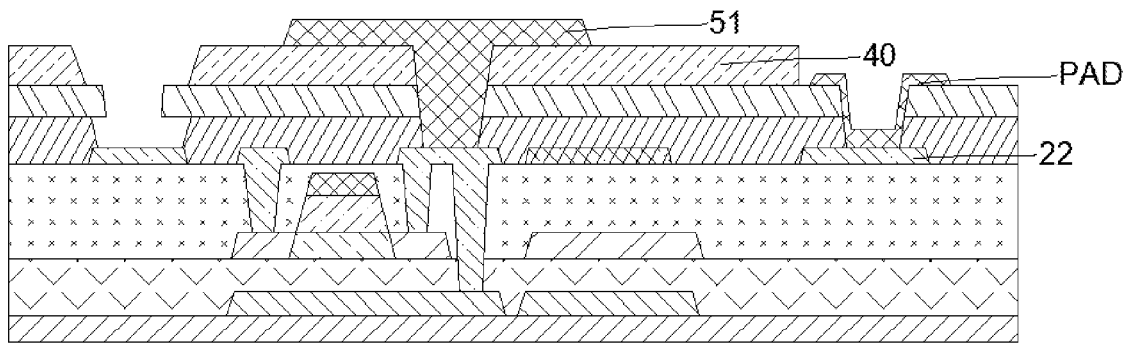

Please refer to FIG. 4(i) to FIG. 4(j). 210: forming an anode 51 and a terminal section PAD on the planarization layer 40.

The anode 51 and the terminal section PAD are formed by physical vapor deposition, exposure, development, and wet etching. The anode 51 is connected to the drain electrode DE through the first contact hole CH1. The terminal section PAD is connected to the peripheral circuit terminal 22 through the second contact hole CH2.

Figure 4K:
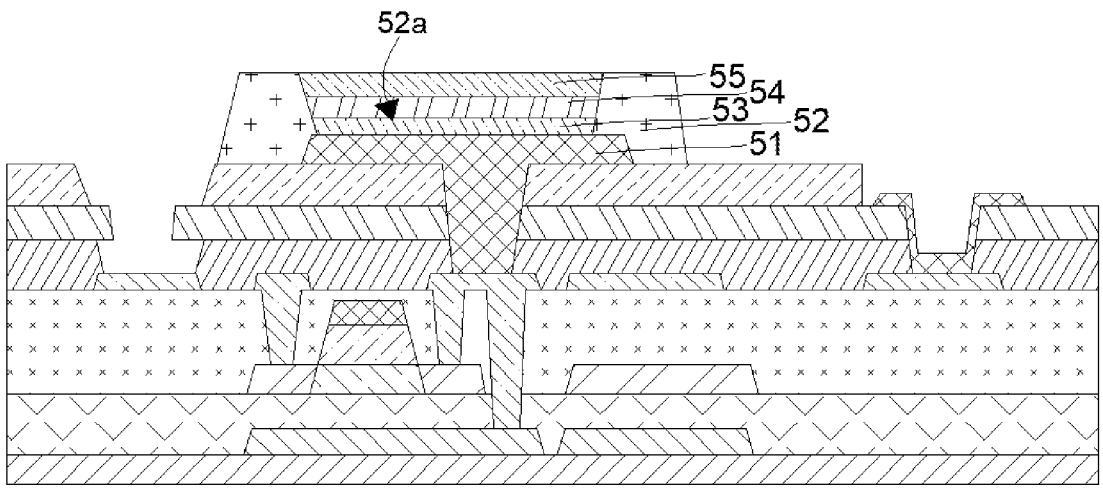

Please refer to FIG. 4(j) to FIG. 4(k). 211: forming a pixel definition layer 52 on the anode 51, wherein a plurality of openings 52a are defined in the pixel definition layer 52.

Figure 4L:
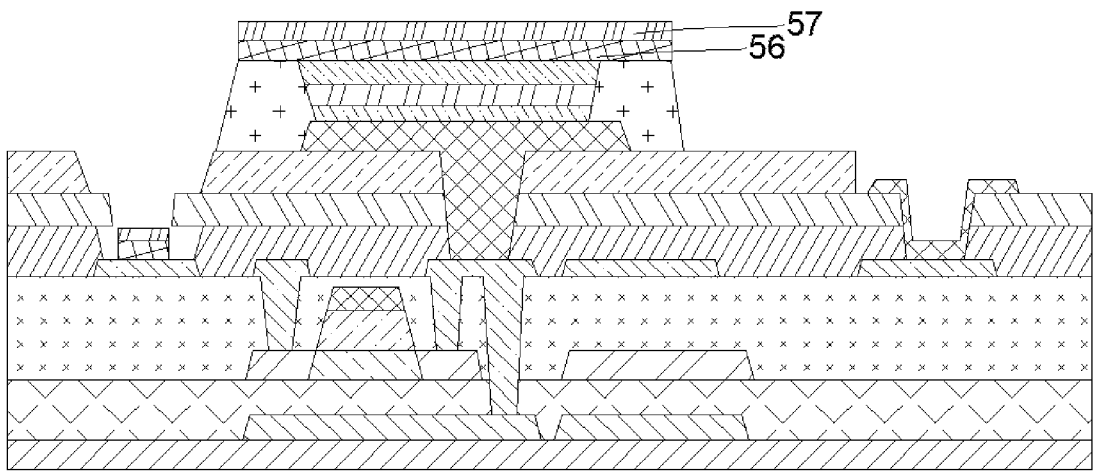

Please refer to FIG. 4(k) to FIG. 4(l). 212: forming a hole inject layer 53, a hole transfer layer 54, and an emitting layer 55 in an opening 52a of the pixel definition layer 52, and evaporating and depositing the electron transfer layer 56 and the electron inject layer 57 on the pixel definition layer 52 and the emitting layer 55.

In the step 212, the first part P1 of the electron transfer layer 56 and the electron inject layer 57 is located on a side of the anode 51 away from the passivation layer 30 and above the thin film transistor T, and the second part P2 is located on the auxiliary cathode 21 in the undercut structure 30a. Because the protruding structure is formed by using the second passivation layer 32, during evaporation deposition, the materials of the electron transfer layer 56 and the electron inject layer 57 are shielded. Therefore, a circle of space around the electron transfer layer 56 and/or the electron inject layer 57 formed in the undercut structure 30a is reserved.

Figure 4M:
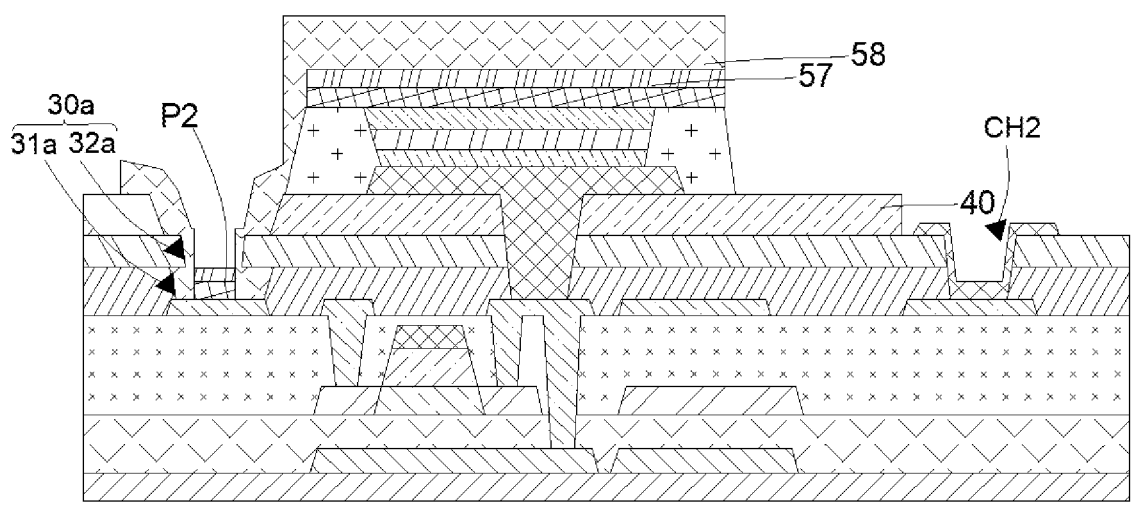

Please refer to FIG. 4(l) to FIG. 4(m). 213: forming a cathode 58 on the electron inject layer 57, wherein the cathode 58 extends into the undercut structure 30a and is connected to the auxiliary cathode 21.

In the step 213, the cathode 58 is formed by a sputtering deposition manner. When the cathode 58 is evaporated and deposited, due to material properties of the cathode 58, the cathode 58 can extend along the lateral walls of the third through hole 40a, the second through hole 32a and the first through hole 31a and occupies the reserved space around the electron transfer layer 56 and the electron inject layer 57 in the undercut structure 30a, thereby connecting to the auxiliary cathode 21.

In this embodiment, the through holes are formed in the planarization layer 40 by using a halftone mask, and then the passivation layer 30 is etched to form the undercut structure 30a. As the accuracy of halftone mask is high, a depth and a width of the formed undercut structure 30a are easier to controlled.

The above provides a detailed description to the embodiments of present application. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. A manufacturing method of an organic light-emitting diode display panel, comprising following steps:
providing a substrate;
forming a thin film transistor layer on the substrate, wherein the thin film transistor layer comprises a source electrode, a drain electrode, and an auxiliary cathode, and the auxiliary cathode is disposed in a same layer with the source electrode and the drain electrode;
forming a passivation layer on the thin film transistor layer, wherein the passivation layer comprises a first passivation layer and a second passivation layer, and the second passivation layer is located on a side of the first passivation layer away from the thin film transistor layer; and using an etching solution to etch the first passivation layer and the second passivation layer to respectively form a first through hole and a second through hole, wherein the first through hole and the second through hole are communicated and constitute an undercut structure, an etching rate of the etching solution to the first passivation layer is greater than an etching rate of the etching solution to the second passivation layer, the undercut structure exposes the auxiliary cathode; and
forming a cathode on the passivation layer, the cathode extends into the undercut structure and is connected to the auxiliary cathode;
wherein after forming the passivation layer on the thin film transistor layer, and before using the etching solution to etch the first passivation layer and the second passivation layer, the manufacturing method comprises:
forming a planarization layer on the passivation layer; and
using a halftone mask to pattern the planarization layer to form a third through hole and a first blind via in the planarization layer; and
wherein using the etching solution to etch the first passivation layer and the second passivation layer comprises:
etching the first passivation layer and the second passivation layer at the third through hole;
wherein after using the etching solution to etch the first passivation layer and the second passivation layer, the manufacturing method comprises:
performing dry etching at the first blind via to form a through hole from the first blind via; and
etching the first passivation layer and the second passivation layer at the through hole to form a contact hole to expose the source electrode of the thin film transistor layer.

2. The manufacturing method of the organic light-emitting diode display panel as claimed in claim 1, wherein
after forming the passivation layer on the thin film transistor layer, and before using the etching solution to etch the first passivation layer and the second passivation layer, the manufacturing method comprises:
using an etching gas to simultaneously etch the first passivation layer and the second passivation layer to from a prefabricated hole in the first passivation layer, wherein the prefabricated hole penetrates through the first passivation layer and the second passivation layer and forms a contact hole on the thin film transistor layer to expose the source electrode of the thin film transistor layer; and
wherein using the etching solution to etch the first passivation layer and the second passivation layer comprises:
using the etching solution to etch the first passivation layer and the second passivation layer at the prefabricated hole.

3. The manufacturing method of the organic light-emitting diode display panel as claimed in claim 1, wherein the organic light-emitting diode display panel comprises a plurality of sub-pixels arranged in an array manner, a light-emitting region and a non-light-emitting region are divided in each of the sub-pixels, the first through hole, the second through hole, and the third through hole constitute an auxiliary cathode connection hole, and the auxiliary cathode connection hole is disposed in the non-light-emitting region.

4. The manufacturing method of the organic light-emitting diode display panel as claimed in claim 1, wherein the first passivation layer comprises silicon oxide, the second passivation layer comprises silicon nitride, the etching solution is hydrofluoric acid, and
an etching rate ratio of the etching solution of silicon oxide to silicon nitride is greater than or equal to 10.

5. The manufacturing method of the organic light-emitting diode display panel as claimed in claim 1, wherein before forming the cathode on the passivation layer, the manufacturing method comprises forming an electronic functional layer on the passivation layer, under occlusion of the undercut structure, a part of the electronic functional layer is located on the auxiliary cathode in the undercut structure, a reserved space is formed around the part of the electronic functional layer; and in forming the cathode on the passivation layer, the cathode occupies the reserved space.

6. The manufacturing method of the organic light-emitting diode display panel as claimed in claim 5, wherein the electronic functional layer comprises at least one of an electron transfer layer or an electron inject layer.

7. The manufacturing method of the organic light-emitting diode display panel as claimed in claim 1, wherein the auxiliary cathode comprises a conductive metal layer and a protection metal layer, the conductive metal layer is disposed between the protection metal layer and the substrate, and a material of the protection metal layer is resistant to corrosion of hydrofluoric acid.

8. The manufacturing method of the organic light-emitting diode display panel as claimed in claim 1, wherein a depth of the undercut structure is greater than 0.2 µm.

9. An organic light-emitting diode display panel prepared by using the manufacturing method according to claim 1, wherein the organic light-emitting diode display panel comprises:
    a substrate;
    a thin film transistor layer disposed on the substrate; wherein the thin film transistor layer comprises a source electrode, a drain electrode, and an auxiliary cathode, and the auxiliary cathode is disposed in a same layer with the source electrode and the drain electrode;
    a passivation layer covering a side of the thin film transistor layer away from the substrate; and
    a cathode disposed on a side of the passivation layer away from the thin film transistor layer; and
    wherein the passivation layer comprises a first passivation layer and a second passivation layer, the second passivation layer is located on a side of the first passivation layer away from the thin film transistor layer, a first through hole is defined in the first passivation layer, a second through hole is defined in the second passivation layer, the first through hole communicates with the second through hole, the first through hole and the second through hole constitute an undercut structure, the undercut structure exposes the auxiliary cathode, and the cathode extends into the undercut structure and is connected to the auxiliary cathode.

10. The organic light-emitting diode display panel as claimed in claim 9, wherein a material of the first passivation layer comprises silicon oxide, and a material of the second passivation layer comprises silicon nitride.

11. The organic light-emitting diode display panel as claimed in claim 9, wherein the cathode is located on a lateral wall of the undercut structure and is connected to the auxiliary cathode.

12. The organic light-emitting diode display panel as claimed in claim 11, wherein the organic light-emitting diode display panel comprises an electronic functional layer, the electronic functional layer is disposed on a side of the cathode close to the passivation layer, a part of the electronic functional layer is located on the auxiliary cathode in the undercut structure, and the cathode is located between a part of the electronic functional layer and the lateral wall of the undercut structure.

13. The organic light-emitting diode display panel as claimed in claim 12, wherein the electronic functional layer comprises at least one of an electron transfer layer or an electron inject layer.

14. The organic light-emitting diode display panel as claimed in claim 9, wherein the auxiliary cathode comprises a conductive metal layer and a protection metal layer, the conductive metal layer is disposed between the protection metal layer and the substrate, and a material of the protection metal layer is resistant to corrosion of hydrofluoric acid.

15. The organic light-emitting diode display panel as claimed in claim 9, wherein the organic light-emitting diode display panel comprises a planarization layer, the planarization layer is disposed on a side of the passivation layer away from the thin film transistor layer, a third through hole is defined in the planarization layer, the third through hole communicates with the second through hole, and the cathode extends from the third through hole into the undercut structure.

16. The organic light-emitting diode display panel as claimed in claim 15, wherein the organic light-emitting diode display panel comprises a plurality of sub-pixels arranged in an array manner, a light-emitting region and a non-light-emitting region are divided in each of the sub-pixels, the first through hole, the second through hole, and the third through hole constitute an auxiliary cathode connection hole, the auxiliary cathode connection hole is disposed in the non-light-emitting region.

17. The organic light-emitting diode display panel as claimed in claim 9, wherein a depth of the undercut structure is greater than 0.2 µm.

18. A manufacturing method of an organic light-emitting diode display panel, comprising following steps:
    providing a substrate;
    forming a thin film transistor layer on the substrate, wherein the thin film transistor layer comprises a source electrode, a drain electrode, and an auxiliary cathode, and the auxiliary cathode is disposed in a same layer with the source electrode and the drain electrode;
    forming a passivation layer on the thin film transistor layer, wherein the passivation layer comprises a first passivation layer and a second passivation layer, and the second passivation layer is located on a side of the first passivation layer away from the thin film transistor layer; and using an etching solution to etch the first passivation layer and the second passivation layer to respectively form a first through hole and a second through hole, wherein the first through hole and the second through hole are communicated and constitute an undercut structure, an etching rate of the etching solution to the first passivation layer is greater than an etching rate of the etching solution to the second passivation layer, the undercut structure exposes the auxiliary cathode; and
    forming a cathode on the passivation layer, the cathode extends into the undercut structure and is connected to the auxiliary cathode;
    wherein after forming the passivation layer on the thin film transistor layer, and before using the etching solution to etch the first passivation layer and the second passivation layer, the manufacturing method comprises:
    using an etching gas to simultaneously etch the first passivation layer and the second passivation layer to from a prefabricated hole in the first passivation layer, wherein the prefabricated hole penetrates through the first passivation layer and the second passivation layer and forms a contact hole on the thin film transistor layer to expose the source electrode of the thin film transistor layer; and wherein using the etching solution to etch the first passivation layer and the second passivation layer comprises:

using the etching solution to etch the first passivation layer and the second passivation layer at the prefabricated hole.

* * * * *